United States Patent
Hassan et al.

(10) Patent No.: US 11,342,947 B1
(45) Date of Patent: May 24, 2022

(54) PACKET PRIORITIZATION FOR NETWORK-BASED SOFTWARE-DEFINED RADIO

(71) Applicant: Microsoft Technology Licensing, LLC, Redmond, WA (US)

(72) Inventors: Amer Aref Hassan, Kirkland, WA (US); Mahendra D. Sekaran, Sammamish, WA (US); Russell Andrew Penar, Highlands Ranch, CO (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/953,170

(22) Filed: Nov. 19, 2020

(51) Int. Cl.
| | | |
|---|---|---|
| *H04B 1/00* | (2006.01) | |
| *H03M 1/68* | (2006.01) | |
| *H04L 69/22* | (2022.01) | |
| *H04W 72/10* | (2009.01) | |
| *H04W 72/08* | (2009.01) | |
| *H04B 1/10* | (2006.01) | |

(52) U.S. Cl.
CPC ........... *H04B 1/0021* (2013.01); *H03M 1/68* (2013.01); *H04B 1/1027* (2013.01); *H04L 69/22* (2013.01); *H04W 72/085* (2013.01); *H04W 72/10* (2013.01)

(58) Field of Classification Search
CPC ....... H04B 1/0021; H04B 1/027; H03M 1/68; H04L 69/22; H04W 72/085; H04W 72/10
See application file for complete search history.

(56) References Cited

U.S. PATENT DOCUMENTS

| 5,406,560 A * | 4/1995 | Kondo ................... G10L 19/04 370/465 |
|---|---|---|
| 8,428,002 B2 | 4/2013 | Gonikberg et al. |
| 8,625,605 B2 | 1/2014 | Kastenholtz et al. |
| 8,630,170 B2 | 1/2014 | Hu et al. |
| 9,780,810 B2 | 10/2017 | Hassan et al. |
| 10,355,720 B2 | 7/2019 | Shattil |
| 2016/0037505 A1 | 2/2016 | Cooklev |
| 2020/0092207 A1 | 3/2020 | Sipra et al. |

OTHER PUBLICATIONS

"Quality of Service (QoS) and How it Works", Retrieved from: https://web.archive.org/web/20190131143955/https:/help.stonesoft.com/onlinehelp/StoneGate/SMC/6.5.0/GUID-F6E6FD9D-768E-4419-ADC2-12D26E792096.html, Jan. 31, 2019, 4 Pages.

Kumar, et al., "Robust H.264/AVC video coding with priority classification, adaptive NALU Privileged and Confidential 11 SK/SC/MT size and fragmentation", In Proceedings of Military Communications Conference, Oct. 18, 2009, pp. 1-6.

* cited by examiner

*Primary Examiner* — Curtis B Odom
(74) *Attorney, Agent, or Firm* — Schwegman Lundberg & Woessner, P.A.

(57) ABSTRACT

Disclosed in some examples are systems, methods, devices, and machine-readable mediums for improved communications between a software-defined radio front-end device and a network-based computing device. Rather than packetize samples together, same bit positions from multiple ADC samples may be packetized together. If a Quality of Service (QoS) metric of the network connection between the RF front-end device and the network-based processing computing drops below a threshold, the RF front-end device may prioritize sending packets with the more significant bits over packets with less significant bits. In other examples, the RF front-end device may prioritize samples corresponding to certain data types over other data types.

20 Claims, 12 Drawing Sheets

PACKET PRIORITIZATION FOR NETWORK-BASED SOFTWARE-DEFINED RADIO

TECHNICAL FIELD

Embodiments pertain to software-defined radios. Some embodiments relate to network-based software-defined radios.

BACKGROUND

A software-defined radio (SDR) is a device that sends and receives data using radio frequency communications in which many of the components typically implemented by dedicated hardware such as mixers, filters, amplifiers, modulators/demodulators, and detectors are implemented by general purpose computing devices such as a desktop computer or an embedded system. In the SDR, a radio frequency (RF) front-end receives a radio signal and passes the signal in an analog form to an analog-to-digital converter (ADC) which samples the radio signal to produce a digital representation of the signal. Depending on the configuration of the SDR, the RF front-end may include one or more antennae, variable-frequency oscillators, mixers, filters, low-noise amplifiers, and/or band-pass filters. A digital processing component, which may be implemented on general purpose computing hardware through software instructions, may then finish processing the signal by perform operations such as mixing, filtering, amplifying, demodulating, and performing other operations to retrieve the transmitted data stream. To transmit data, a reverse process is employed in which the input data stream is processed by the digital processing component, sent to the front-end component for conversion to an analog signal (e.g., by a digital-to-analog converter (DAC)) and transmitted.

SDRs allow increased flexibility by replacing components traditionally implemented in dedicated hardware with software. By changing the software, the capabilities of the SDR may be adapted using the same hardware. For example, by modifying the software, the SDR can be adapted to receive and transmit different radio protocols which allows SDRs to be more flexible and to adapt to changing conditions.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
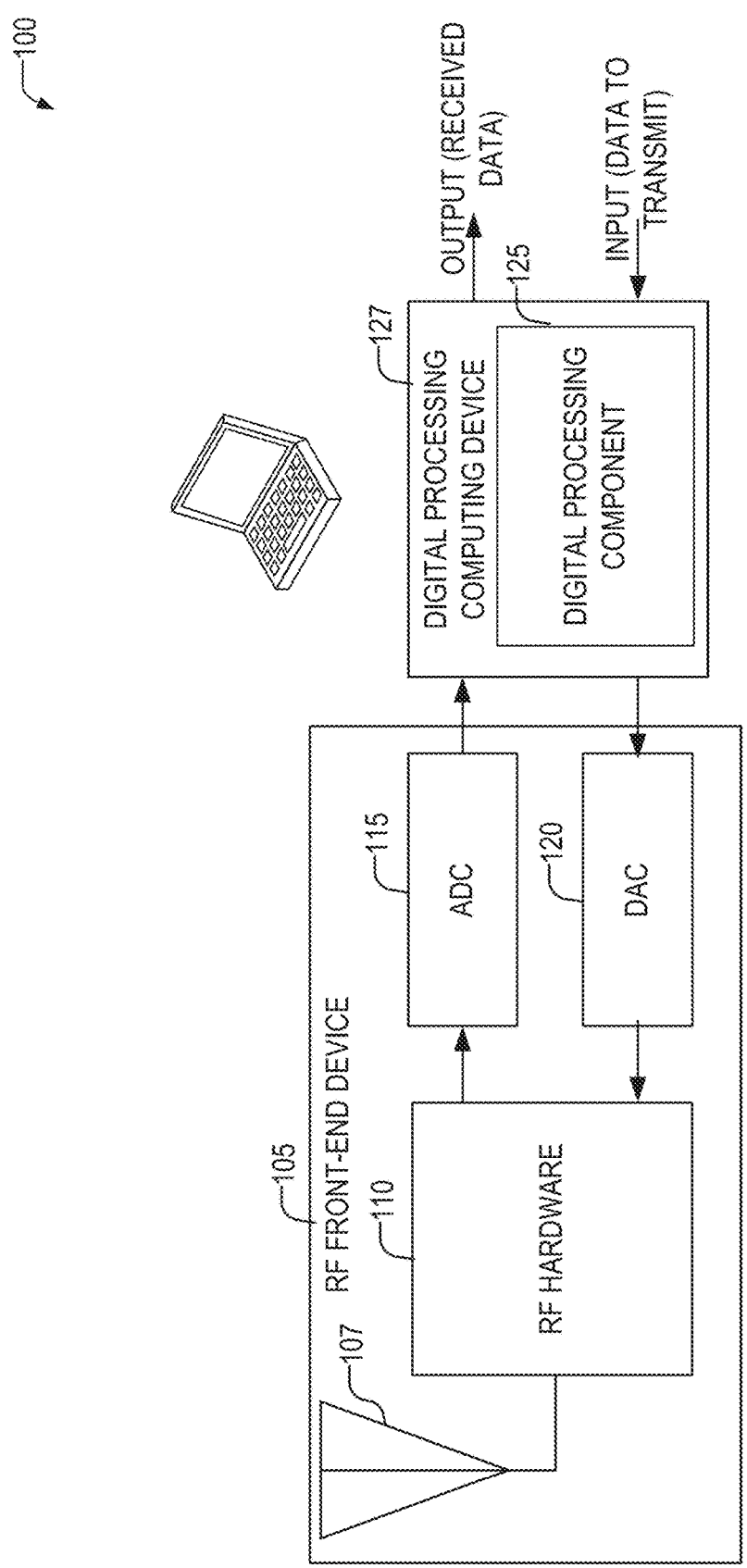
FIG. 1 illustrates a diagram of an SDR system according to some examples of the present disclosure.

In traditional SDRs, the computing device that executes the digital processing component to process the output of the ADC, termed herein as a digital processing computing device, is typically connected to the ADC and the RF front-end device through a local connection. In the traditional SDR model, each SDR needs a local computing device. In some examples, in order to take advantage of the increased computing power, availability, centralized maintenance, and cost savings of network-based computing devices (sometimes referred to as cloud computing), network-based SDRs packetize the output of the ADC send it over a network to a centralized server. The centralized server then implements the digital processing component for one or more RF front-end devices on network-based computing devices.

Rather than sending data to a centralized server, a network-based SDR system may be further modified to take advantage of edge computing concepts where computing resources closer to the RF front-end devices are used to implement the digital processing component. Because the digital processing component is provided by edge computing resources that are closer to the RF front-end devices (as compared with centralized network-based computing devices), latency is decreased and the chances of network congestion diminish because the data will typically have to traverse fewer network links. The edge computing resources may then pass the data to other computing resources, such as a communication server or the like.

In traditional network-based software-defined radio implementations (either the traditional centralized cloud concepts or the edge computing concepts), the stream of samples output by the ADC is packetized as it is sampled and sent to the digital processing component. For example, if the packet size is 32 bits and each sample is 8 bits, then four consecutive samples are packetized and sent. If a packet is lost, then four consecutive samples are lost. This may cause issues, especially if the data that is lost is signaling data, or other data that is sensitive to loss (such as audio data).

Disclosed in some examples are systems, methods, devices, and machine-readable mediums for improved communications between a software-defined radio front-end device and a network-based computing device. Rather than packetize samples together, same bit positions from multiple ADC samples may be packetized together. For example, the most significant bits of a group of ADC samples may be packetized together, the second most significant bits of the group may be packetized together, and so on. If a Quality of Service (QoS) metric of the network connection between the RF front-end device and the network-based processing computing drops below a threshold, the RF front-end device may prioritize sending packets with the more significant bits over packets with less significant bits. By packetizing the samples in this manner, some precision in the output of the ADC may be lost if packets containing bits of lesser significance are lost, however, this method ensures that at least some estimation of the signal is possible. This is in contrast with the current methods of packetization which result in sample loss for at least a period of time.

This solves a technical problem of data loss due to network problems in network-based SDRs by the technical solution of prioritizing certain packets based upon the significance of the bit values in the packet. Packets having lesser significant bits can be discarded or delayed in favor of packets carrying higher significant bits. While some precision is lost, whole samples are not lost, and the processing components may be able to reconstruct the missing bits for example using error correction codes. In this manner, the system essentially rounds the value of the samples.

Since the RF front-end device has no advanced knowledge of the contents of the signal (as it has not been processed yet), using traditional SDRs, there is no way to prioritize certain types data over other types of data. For example, signaling and control data may be more important than other types of data. Similarly, for certain applications, some data may be more important than other types of data. For example, in a real-time communications application, audio data may be more important than video or screen sharing data. In the face of network issues, it would improve performance to prioritize packets including ADC samples corresponding to the most important types of data over other packets that have samples corresponding to less important data types.

Also disclosed are techniques which provide to the RF front-end device knowledge of what data types are represented by the signal processed by the ADC to determine the importance of the data and to prioritize packets containing those samples accordingly. The samples may be prioritized using a prioritization scheme which specifies one or more data types and a priority of each data type. The prioritization scheme may be specific to a radio protocol, an upper layer protocol, a end-user device, an application, or the like. For example, samples representing signaling data may be prioritized over all other data. Samples representing data for certain media types may be prioritized over other media types. For example, if the radio transmission is transmitting media for a network-based communication session (e.g., the application is an online meeting), then samples encoding audio data may be prioritized over samples encoding video data. Audio data is much more sensitive in terms of user experience to discontinuities brought on by network noise than video data. Prioritization of samples based upon data type is normally not done at the RF front-end device because the RF front-end device is not typically aware of the payload of the signal and therefore does not know which samples encode which data.

The RF front-end device may determine the payload in a number of ways. For example, the processing computing device may signal the RF front-end device to inform the RF front-end device of the media type being sent. Similarly, the device transmitting the data received at the RF front-end device (referred to herein as the transmitter) may signal the RF front-end device of the media type being sent—either in-band (e.g., as part of the RF transmission), or out of band (e.g., through another network connection).

Examples in which packets are prioritized based upon the data type may be applied in addition to, or instead of, the techniques previously described that packetize most significant bits of a group of samples together, the second most significant bits of a group of samples together, and so on. For example, the samples may be first grouped based upon data type that they encode and second, the sample groups may be separately packetized such that the most significant bits of each group are packetized together and so on. Various prioritization schemes may then select which packets are prioritized. For example, packets encoding the most significant bits of signaling data may be prioritized over lesser significant bits of signaling data. The lesser significant bits of signaling data may be prioritized over the most significant bits of audio data. The lesser significant bits of the audio data may be prioritized over the most significant bits of video data, which may be prioritized over the lesser significant bits of video data, and so on.

This solves a technical problem of data loss due to network problems in network based SDRs by the technical solution of implementing feedback from the processing component executing on the processing computing device or transmitter to allow the RF front-end device to make informed decisions on prioritizing data. This improves system performance where network issues may be occurring between the RF front-end device and the digital processing computing device by prioritizing important data necessary to maintain a connection or to maintain an acceptable user experience. Packets having more important contents may be prioritized over packets with less important contents. This ensures that sessions stay connected (e.g., both application layer connections and lower level connections) and that the most important media is delivered without delay at the expense of less important media.

Turning now to FIG. 1, a diagram of an SDR system 100 is shown according to some examples of the present disclosure. RF front-end device 105 may include one or more antennas 107. Radio Frequency (RF) hardware 110, an analog-to-digital converter (ADC) 115, and a digital to analog converter (DAC) 120. The RF hardware 110 may include a number of components depending on the configuration. Example configurations may include a heterodyne, zero-IF, digital low-IF, bandpass sampling, and direct RF sampling configuration. For example, for a digital IF heterodyne structure, the RF hardware 110 may include a first RF bandpass filter (BPF), a low noise amplifier, a second BPF, a mixer, an IF BPF, and an IF amplifier. In a direct conversion/zero IF structure the RF hardware 110 may include an RF BPF, a Low Noise Amplifier, the RF signal is then converted directly into zero frequency (DC) by an I/Q demodulator, Low Pass Filters for the I and the Q channels, and one or more variable gain amplifiers.

The ADC 115 converts an analog signal to a digital signal through sampling at periodic time intervals set by an ADC clock. The samples may be, in some examples, samples of the amplitude of the RF signal. The output of the ADC 115 is a digital representation of the analog signal. Digital processing component 125 executing on a digital processing computing device 127 (such as a personal computer) may process the digital representation of the analog signal such as by performing baseband processing. Information to be transmitted is converted from a digital signal into an analog signal by the DAC 120 which is then transmitted by the RF hardware 110 and antenna 107. In some examples, the digital processing computing device 127 may be in the form of a personal computing device, server computing device, or other general purpose computing device.

Figure 2:
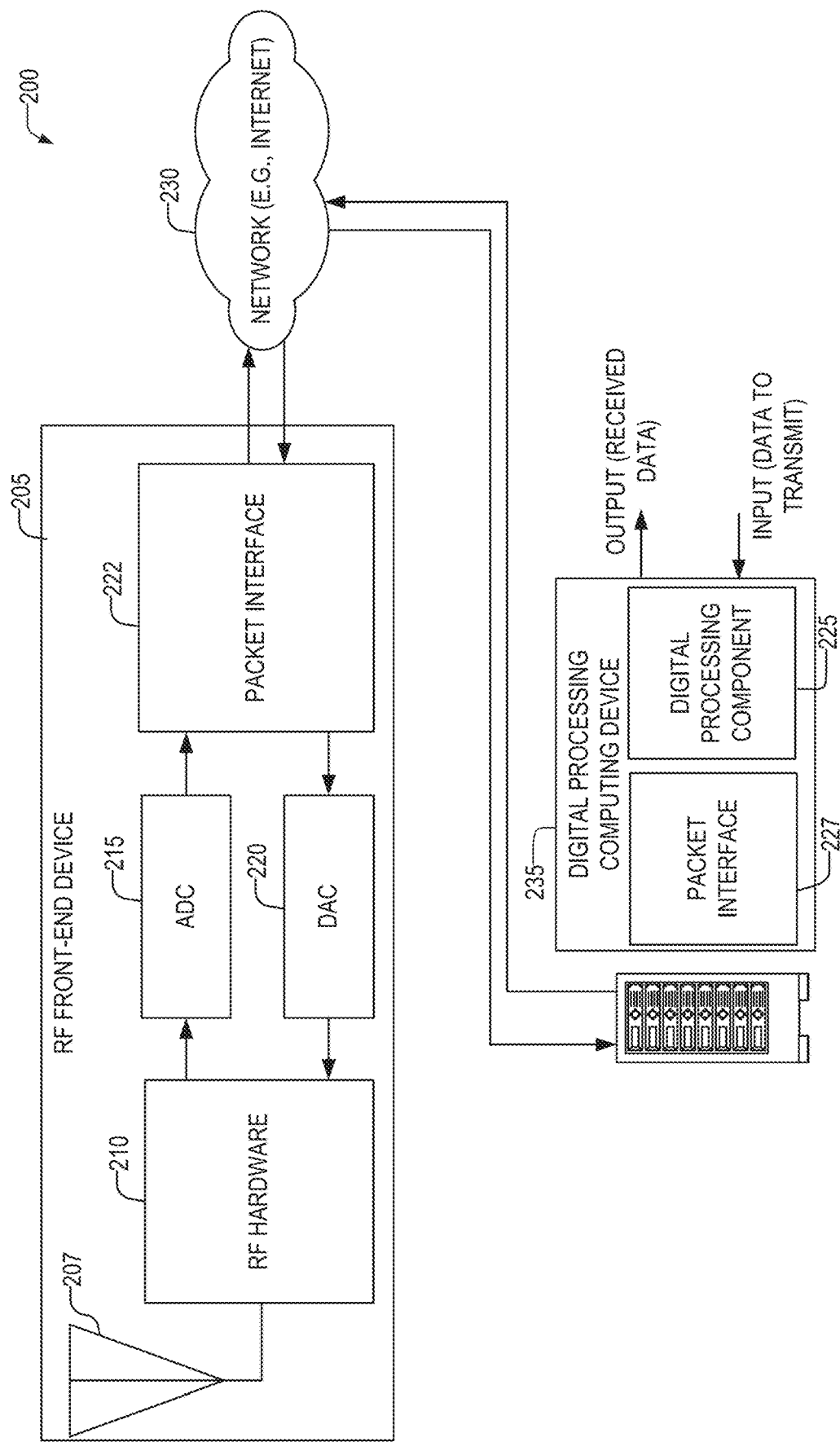
FIG. 2 illustrates a diagram of a network-based SDR system according to some examples of the present disclosure.

FIG. 2 illustrates a diagram of a network-based SDR system 200 according to some examples of the present disclosure. RF front-end device 205 includes one or more antenna(s) 207 (which may be a same component or similar component as antenna 107), a RF hardware 210 (which may be a same component or similar component as RF hardware 110), an ADC 215 (which may be a same component or similar component as ADC 215), a DAC 220 (which may be a same component or similar component as DAC 120). Additionally, the RF front-end device 205 may have a packet interface 222. Packet interface takes the signal samples produced by the ADC 215, packetizes it, and sends it over network 230 to the digital processing computing device 235 (which may be a general purpose computing device such as a server computer) that executes the network-based digital processing component 225 (which may be a same component or similar component as digital processing component 125 of FIG. 1). In addition to the functions described for digital processing component 125, network-based digital processing component 225 may also include a packet interface 227 that depacketizes the digital samples before further processing.

Packet interface 222 and packet interface 227 may also implement one or more protocols, such as a Transport Control Protocol (TCP), Internet Protocol (IP), or the like. Network 230 is any type of data communication network, including packet-based networks such as the Internet. Packet interface 222 may be implemented by software executing on a processing device of RF front-end device 205 or may be implemented by an integrated circuit with hardware logic or a combination of software and hardware logic.

Figure 3:
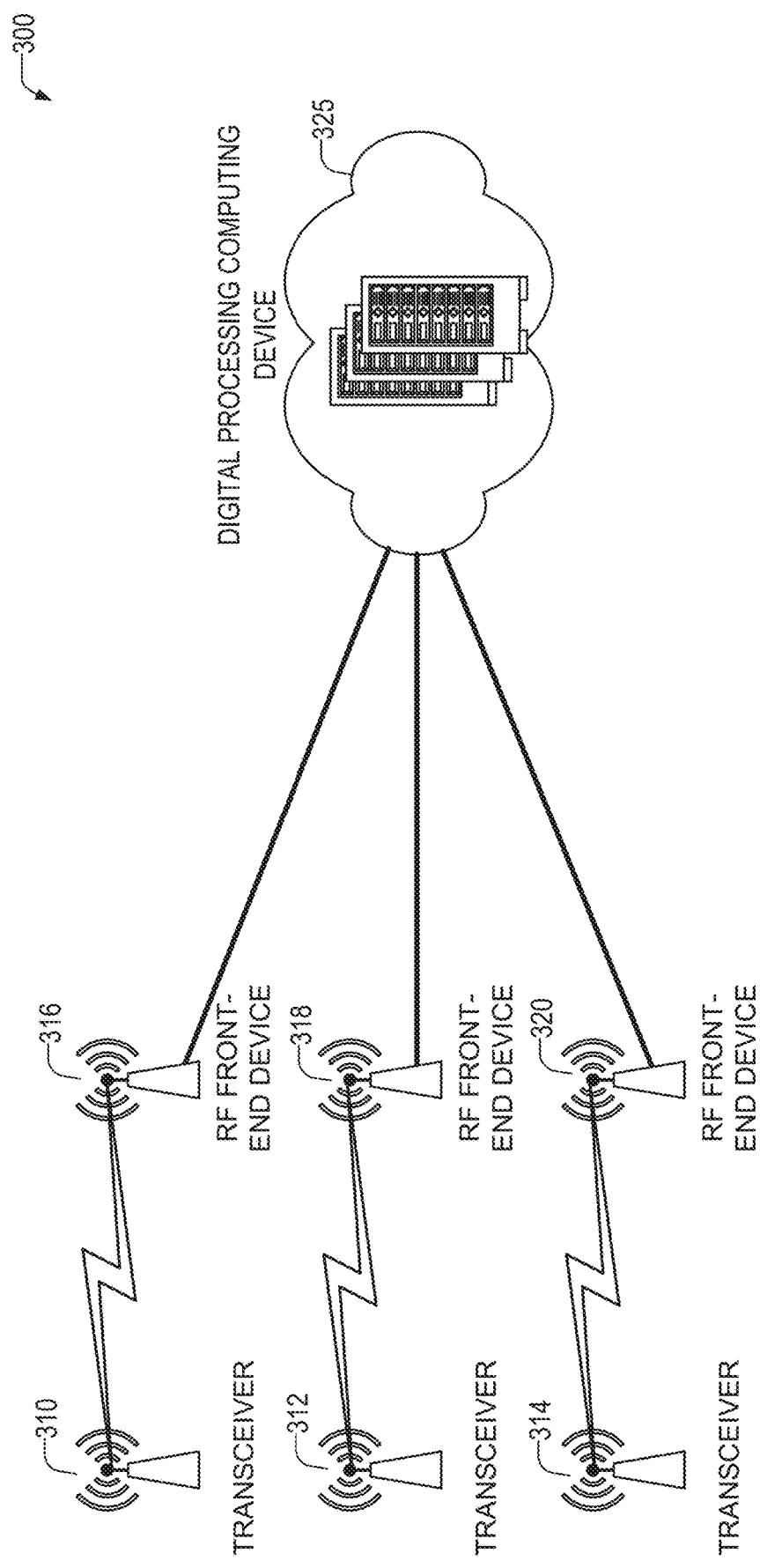
FIG. 3 illustrates a diagram of a centralized network-based SDR system according to some examples of the present disclosure.

FIG. 3 illustrates a diagram of a centralized network-based SDR system 300 according to some examples of the present disclosure. Transceivers 310, 312, and 314 transmit and receive radio signals with RF front-end devices 316, 318, and 320 respectively. Transceivers 310, 312, and 314 may be traditional radio transmission and reception devices that rely upon traditional specially designed hardware such as cellphones, or one or more of the transceivers 310, 312, and 314 may be an SDR (including a network-based SDR). RF front-end devices 316, 318, and 320 may be an example of RF front-end device 205 which may packetize the output of the ADC and send it to a centralized network-based digital processing computing device 325. Centralized network-based digital processing computing device 325 may be an example of digital processing computing device 235 of FIG. 2.

Figure 4:
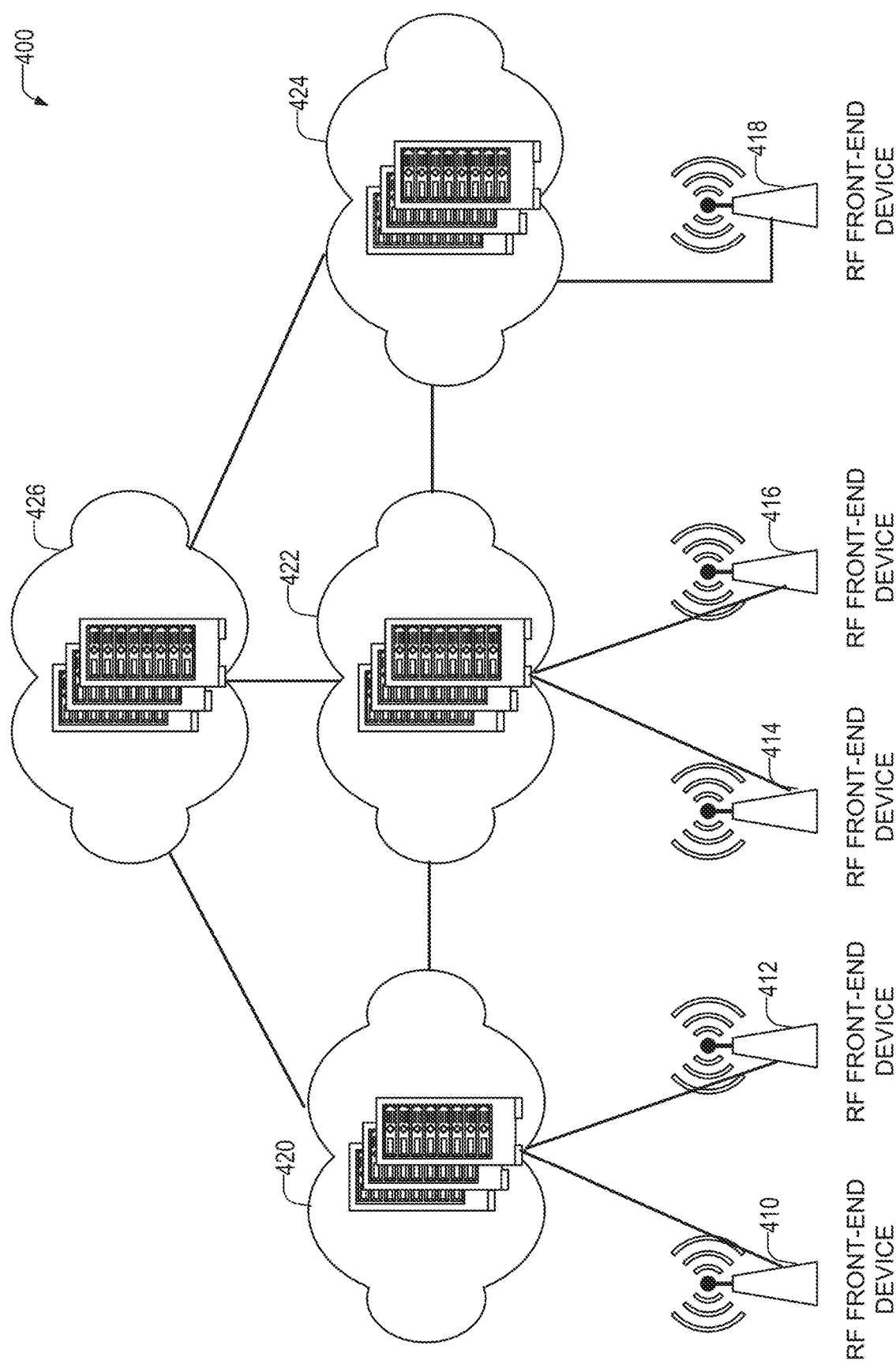
FIG. 4 illustrates a diagram of an edge-network-computing based SDR system according to some examples of the present disclosure.

FIG. 4 illustrates a diagram of an edge-network-computing based SDR system 400 according to some examples of the present disclosure. In FIG. 4, the transceivers shown in FIG. 3 (transceivers 310, 312, and 314) are not shown for increased clarity. RF front-end devices 410 and 412 may packetize data from their ADC devices and send them to network-based digital processing computing device 420. RF front-end devices 414 and 416 may packetize data from their ADC devices and send them to network-based digital processing computing device 422. RF front-end device 418 may packetize data from its ADC device and send the data to network-based digital processing computing device 424. Network-based digital processing computing devices 420, 422, and 424 may communicate with other network-based digital processing computing devices or with a server computing device 426. For example, some processing of the ADC samples may be done on one of the network-based digital processing computing devices 420, 422, and 424 with the rest of the processing done on another one of the network-based digital processing computing devices 420, 422, and 424 or server computing device 426.

In other examples, the network-based digital processing computing device 420, 422, or 424 may communicate with another one of network-based digital processing computing devices 420, 422, or 424 to forward data destined for one of the RF front-end devices 410, 412, 414, 416, and 418. For example, data received at RF front-end device 410 may be destined for a receiver that receives data sent by RF front-end device 414. In this example, the ADC output is packetized and sent from RF front-end device 410, processed by network-based digital processing computing device 420, and sent to network-based digital processing computing device 422, and then transmitted by RF front-end device 414.

In some examples, the various network-based digital processing computing devices 420, 422, and/or 424 may be located such that they are geographically close to the RF front-end device that they serve to reduce latency.

Figure 5:
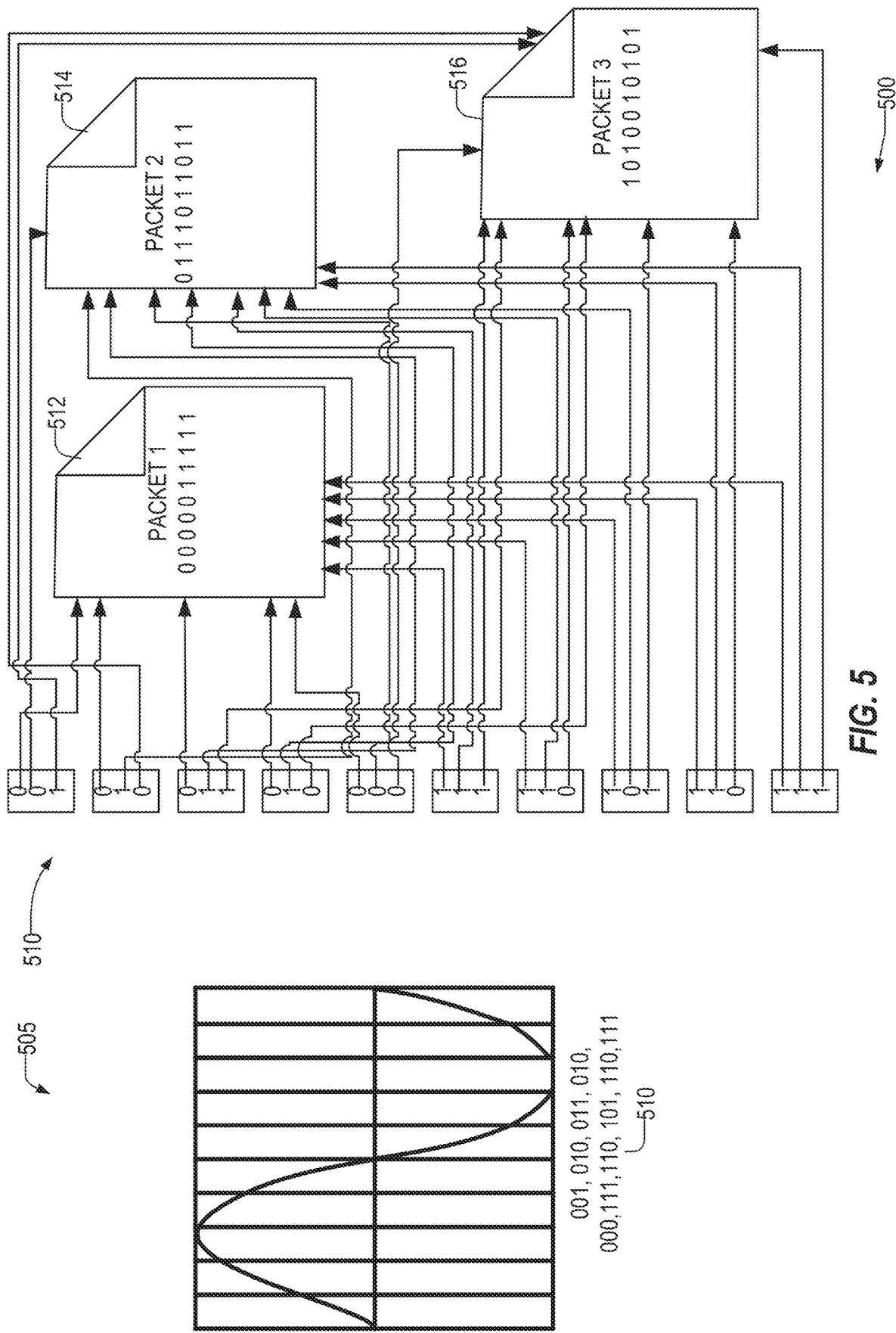
FIG. 5 illustrates an example diagram of a packet construction according to some examples of the present disclosure.

Turning now to FIG. 5, an example diagram of a packet construction 500 is shown according to some examples of the present disclosure. A received analog waveform 505 is plotted. The plot of FIG. 5 illustrates an example amplitude sampling of the waveform as samples 510 {001, 010, 011, 010, 000, 111, 110, 101, 110, 111}. One of ordinary skill in the art with the benefit of the present disclosure will appreciate that other forms of sampling may be used and that the output shown in FIG. 5 and discussed herein is exemplary and used for purposes of illustrating the packetization of the samples.

In the example of FIG. 5, the ADC samples the analog waveform 505 and produces ten samples 510. Samples 510 are each three bits in length. Samples 510 are then rearranged into packets 512, 514, and 516. The most significant bits of each sample are assigned to packet 512, the middle bit of each sample is assigned to packet 514, and the least significant bit is assigned to packet 516. The ordering of the bits in the packets may correspond to the ordering of the samples output by the ADC. In other examples, the bits may be ordered in a different ordering. While in FIG. 5, each bit of a sample is packetized in a separate packet, in other examples, multiple bits of a sample may be sent in a single packet. For example, the most significant and middle bits may be included in a same packet.

Figure 6:
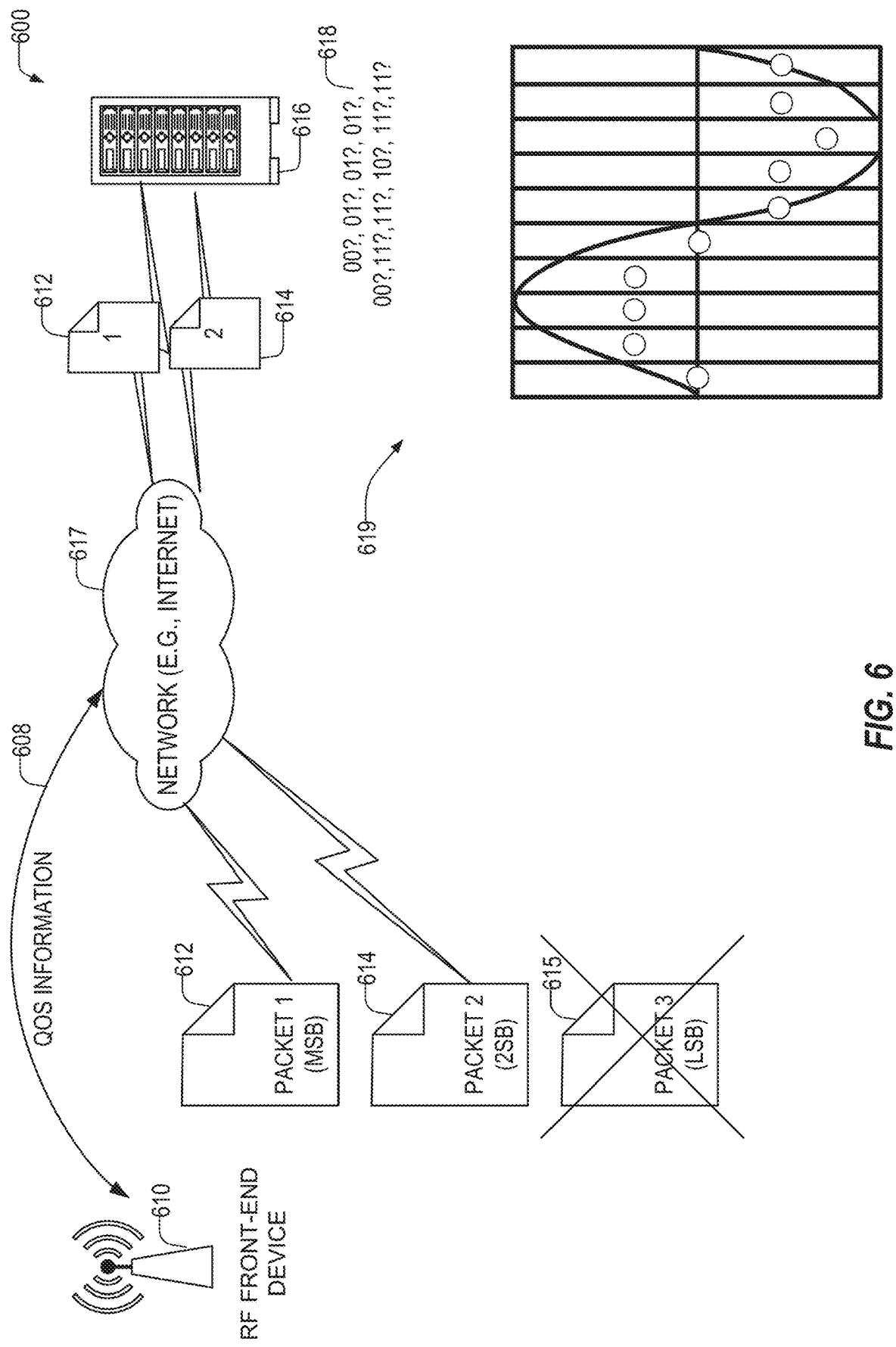
FIG. 6 illustrates a diagram of network congestion management in a network-based SDR system according to some examples of the present disclosure.

Turning now to FIG. 6, a diagram of network congestion management in a network-based SDR system 600 is shown according to some examples of the present disclosure. RF front-end device 610 receives a radio signal and an ADC converts it to digital samples. The RF front-end device 610 may be an example of RF front-end device 205 of FIG. 2. In addition, the RF front-end device 610 may determine Quality of Service (QoS) information 608 of the network 617 that is used to send the packetized samples to the network-based digital processing computing device 616. Network-based digital processing computing device 616 may be an example of network-based digital processing computing device 225 of FIG. 2. System 600 may be either a centralized or edge computing model as shown in FIG. 3 or 4. The RF front-end device 610 packetizes the samples according to the method described herein and shown in FIG. 5.

In the example of FIG. 6, the QoS information indicates that a QoS metric of the network meets a prespecified criteria. For example, the bandwidth is below a threshold bandwidth amount; the quality is less than a threshold quality; a packet loss measurement is above a threshold; or the like. In response, the RF front-end device 610 may take one or more actions. For example, the RF front-end device 610 may set one or more QoS fields of the packets 612, 614, or 615 such that the first packet 612 has the highest priority, the second packet 614 has the second highest priority and the third packet 615 has the lowest priority. Devices in the network 617 may then handle the packets according to the QoS parameters. In other examples, the RF front-end device 610 may drop one or more of the lower priority packets (e.g., the third packet). As shown, the third packet 615 is dropped and the first and second packets 612 and 614 are thus received by the digital processing computing device 616. This produces the samples 618, which are shown graphed 619 next to the original waveform. While the reconstructed waveform is not a perfect match, it more closely approximates a correct waveform than a reconstructed waveform that is missing samples completely.

Figure 7:
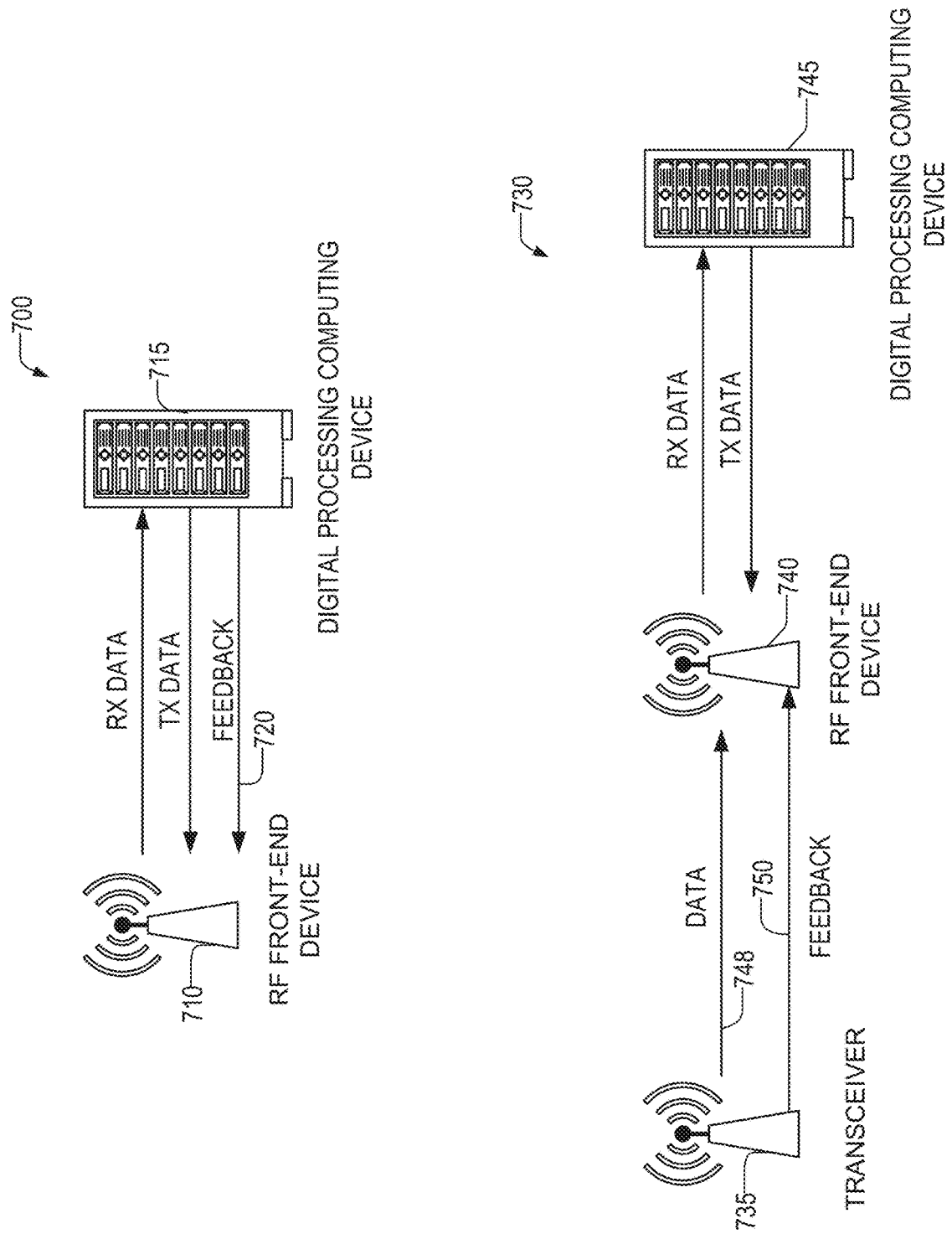
FIG. 7 illustrates a diagram of a feedback indication sent from a network-based digital processing computing device or the transceiver to determine the priority of one or more samples output from the ADC according to some examples of the present disclosure.

FIG. 7 shows a diagram of a feedback indication sent from a network-based digital processing computing device or the transceiver to determine the priority of one or more samples output from the ADC according to some examples of the present disclosure. In example 700, the network-based digital processing computing device 715 (which may be an example of network-based digital processing computing device 225 from FIG. 2) may process the packetized samples received from the RF front-end device 710 (which may be an example of RF front-end device 205 from FIG. 2). The samples may be decoded, and the type of data that the samples correspond to may be determined. The type of data may be sent back to the RF front-end device 710 using feedback messaging 720.

In example 730, the digital processing computing device 745 may not provide feedback. In these examples, the transceiver 735 transmits feedback messaging 750 along with the data 748 to the RF front-end device 740. Feedback in feedback messaging 750 describes or indicates a type of the data 748. The feedback messaging 750 may be transmitted as part of the data 748, such as metadata, or may be transmitted separately. For examples in which the feedback messaging 750 is transmitted as part of the data 748, the feedback messaging 750 may be sent as an easily recognizable symbol pattern to the RF front-end device 740. The RF front-end device 740 may recognize the pattern and decode it to determine the data type of data that follows. In other examples, a side-band or second radio link or channel may be used to send the feedback messaging 750.

In still other examples, the feedback messaging 750 may be sent through an out-of-band connection, such as through a second radio-frequency connection using a different wireless protocol than that used to send the data 748. For example, through a WiFi connection of the transceiver 735 to a wireless access point (not shown in FIG. 7) and through a network to the RF front-end device 740. Since the feedback data in feedback messaging 750 may be substantially smaller in size than the media being transmitted over the radio link between the transceiver 735 and the RF front-end device 740, this may be used where the WiFi connection has a lower bandwidth. Other connections include other wired, and/or wireless connections that are either direct connections or through one or more intermediary devices.

The feedback data in feedback messaging 720,750 may be an indication of the type of data currently being sent; a timestamp of when a particular type of data will begin, signal pattern information that can be used by the RF front-end devices 710,740 to find data of a certain type, or the like. For example, packets may be sent by the transceiver 735 using a particular structure such that signaling, and other information may be sent in a header first and then the payload may be sent afterwards. In some examples, the headers may be carry signaling information and may be prioritized by the RF front-end devices 710, 740 over the payload data which may have less important media types.

As previously described, the system of FIG. 7 may work in conjunction with the packetization system described with respect to FIG. 5. For example, samples corresponding to different media data types may be aggregated together and the process of FIG. 5 may be applied to those groups. In some examples where the media types may be interspersed throughout the received analog signal, the RF front-end device may transmit reconstruction information (e.g., information on which order the samples were created—such as a sequence number) to the digital processing computing device to help the digital processing computing device reconstruct the samples in a proper order.

Figure 8:
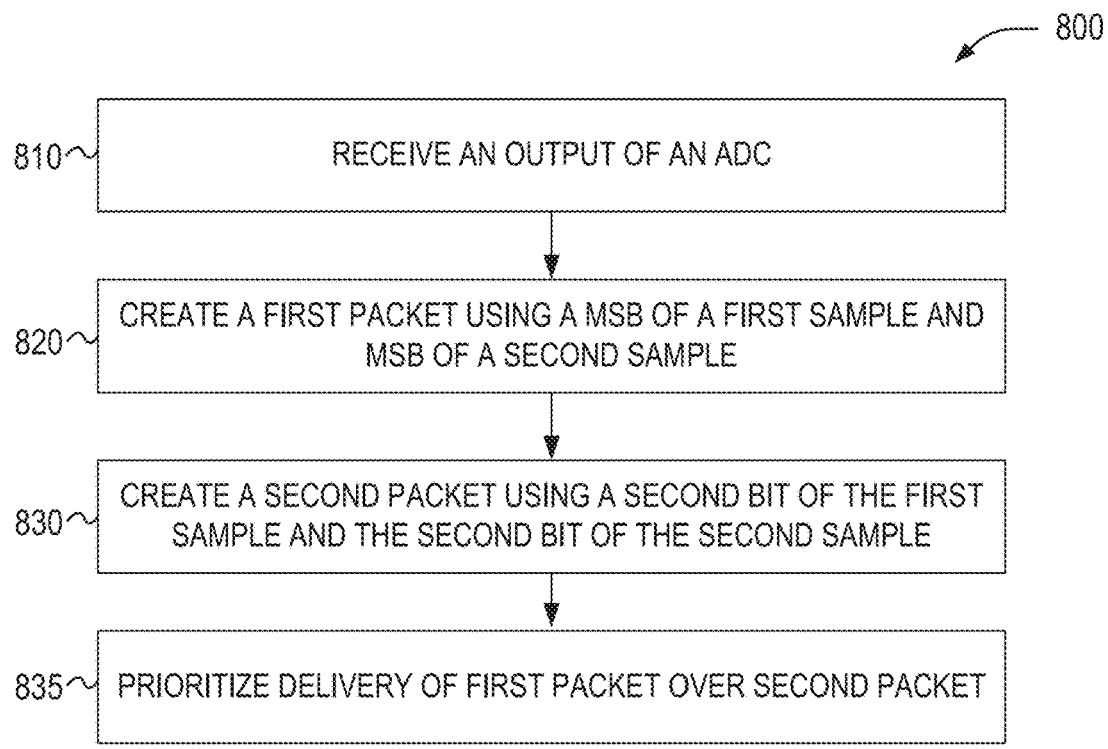
FIG. 8 illustrates a flow chart of a method of packetizing samples output by an ADC of an SDR according to some examples of the present disclosure.

FIG. 8 illustrates a flow chart of a method 800 of packetizing samples output by an ADC of an SDR according to some examples of the present disclosure. At operation 810, a computing device (e.g., a processor) of a RF front-end device receives output of an ADC. The output may be a plurality of digital samples of a RF signal received by the RF front-end device. Each digital sample may be a numerical representation of an RF signal at a particular time and comprises a plurality of bits, including a most significant bit and a second bit that is less significant than the most significant bit. In some examples, the method 800 is applied to a plurality of samples. The number of samples may be selected based upon the number of bits per sample that is packetized in a same packet and the packet size. For example, if the packet size is thirty-two bits, the number of bits per sample placed in a same packet is two, then the number of samples processed in the method 800 may be 16.

At operation 820 a first packet may be created using a most significant bit of a first sample and a most significant bit (MSB) of a second sample. Depending on the number of samples processed and the packet size, additional most significant bits of additional samples may also be included. As already noted, additional bits of each sample may also be included in the first packet.

At operation 830, a second packet may be created using a second bit of the first sample and a second bit of the second sample. Depending on the number of samples processed and the packet size, additional bits of additional samples may also be included that were not placed in the first packet. As already noted, additional bits of each sample may also be included in the first packet. In some examples, one or more bits may be duplicated across packets. That is, a first bit of a sample may be packetized in multiple packets to add additional redundancy to ensure those bits arrive at the digital processing computing device.

At operation 835, the RF front-end device may prioritize delivery of the first packet over the second packet. In some examples, this may be accomplished by setting a QoS parameter in the first packet such that the first packet is prioritized by the network over the second packet. In some examples, this be accomplished by dropping (not sending)

the second packet and sending only the first packet if network conditions meet certain QoS criteria. In some examples, both the QoS parameters may be set and the second packet may be dropped. In still other examples, other actions may be taken in addition to, or instead of dropping packets and/or setting QoS criteria. For example, sending the first packet twice but the first packet only once. Where packets are not sent by the RF front-end device, in some examples, the RF front-end device sends indicators to inform the digital processing computing device that bits from samples are missing. This prevents the digital processing computing device from waiting for the missing data and reduces latency. In some examples, the indicators are sent along with packets that are sent; in still other examples, packets are sent to the digital processing computing device containing the indicators. These indicators may be small compared to the packets that are not sent, so these indicators may not be affected by or effect network congestion in the same manner.

Figure 9:
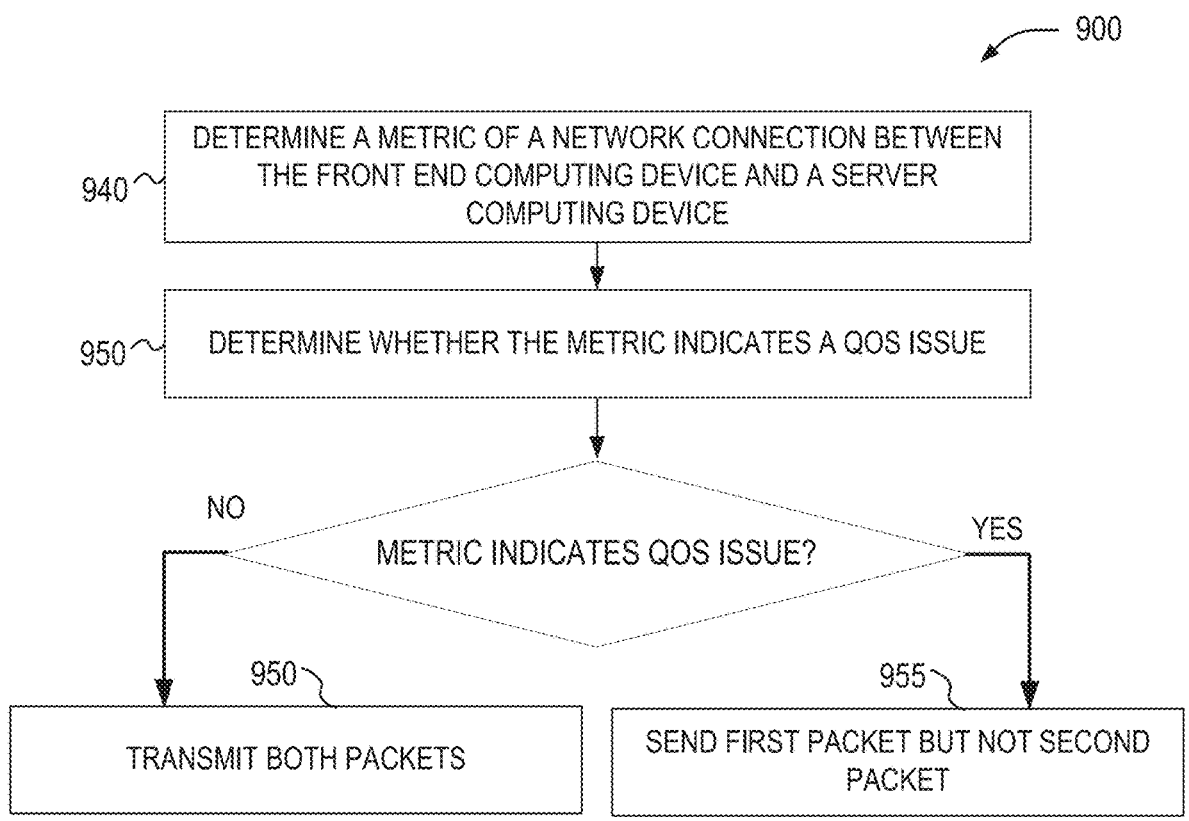
FIG. 9 illustrates a flowchart of a method of prioritizing delivery of packets according to some examples of the present disclosure.

FIG. 9 illustrates a flowchart of a method 900 of prioritizing delivery of packets according to some examples of the present disclosure. Method 900 may be an example of operation 835. At operation 940, a metric of a network connection between the RF front-end device computing device and a server computing device may be determined. The server computing device may be a network-based digital processing computing device. The metric may be a QoS metric such as a bandwidth metric, a packet latency metric, a packet loss metric, a packet error metric, a packet quality metric, or the like. The QoS metrics may be determined based upon previously sent packets, test packets, polling packets, or the like.

At operation 950, the RF front-end device may determine whether the metric indicates a QoS issue. For example, by comparing the metric to a threshold (e.g., the metric exceeds a threshold, is below a threshold, or the like). If the metric indicates a QoS issue, then at operation 955, the first packet is sent, but the second packet is not sent. If the metric does not indicate a QoS issue, then at operation 950, both packets are sent. When packets containing bits of samples of the ADC are not sent or are lost by the network, the digital processing computing device may substitute one or more bits. For example, all lost bits may be assigned to be zero bits, one bits, or the like.

Figure 10:
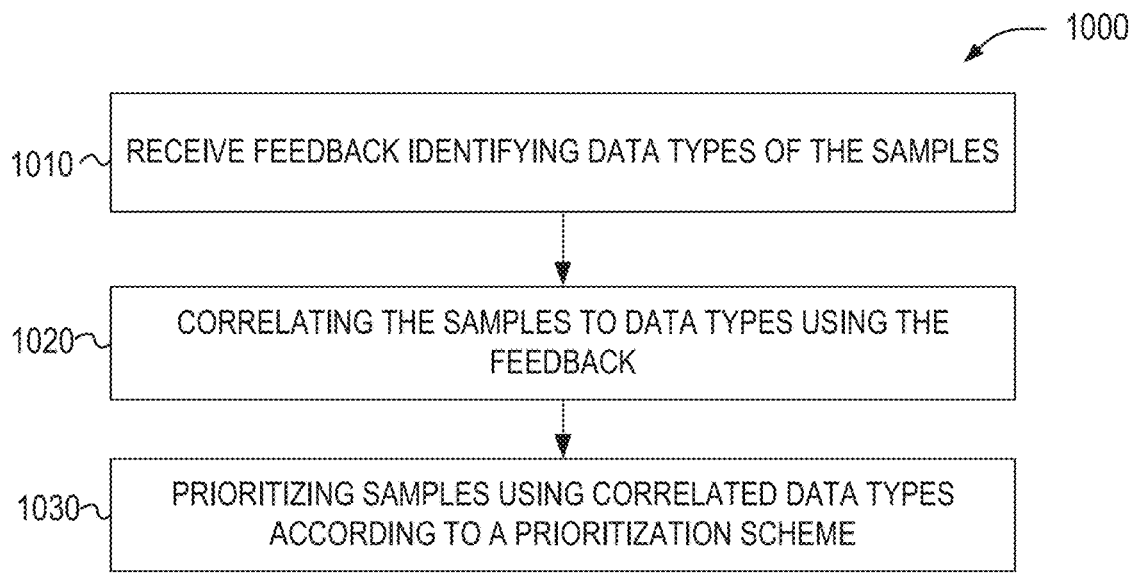
FIG. 10 illustrates a flowchart of a method of a radio RF front-end device prioritizing packets that include ADC samples representing certain data types according to some examples of the present disclosure.

Turning now to FIG. 10, a flowchart of a method 1000 of a radio RF front-end device prioritizing packets that include ADC samples representing certain data types is shown according to some examples of the present disclosure. At operation 1010 the radio RF front-end device may receive feedback identifying data types of one or more of the samples. As noted the feedback may be an indication of a currently received or transmitted data type (such as control data, voice data, video data, or the like); may be a pattern of received or transmitted data (e.g., every third sample is video data); or the like. The feedback may be received from either the digital processing computing device or the transmitter. The feedback may be received from metadata in the radio signal, a second radio signal, or from an out-of-band network connection.

At operation 1020, the RF front-end device correlates the samples from the ADC to data types using the feedback. For example, if the feedback is a pattern, the samples corresponding to each data type may be identified. If the feedback is an indication of the currently received data type, then the current samples are correlated to that data type.

At operation 1030, the radio RF front-end device prioritizes samples according to the correlated data type according to a prioritization scheme by prioritizing packets including those samples. An example prioritization scheme may include prioritizing samples representing signaling or control data highest, prioritizing samples representing audio next, prioritizing samples representing video next, and finally samples representing other data (such as chat communications, files, or other data) may be prioritized lowest. One of ordinary skill in the art with the benefit of the present disclosure will appreciate that other prioritization schemes may be used. Samples may be prioritized by setting a QoS parameter in the packet. Computing devices such as routers on a network path between the radio RF front-end device and the network-based digital processing computing device 225 may use this QoS information to determine priorities for packets in queueing, guaranteed delivery, and other parameters. QoS parameters may signify different treatment for different packets.

In other examples, rather than, or in addition to the QoS parameters, the radio RF front-end device may determine that a QoS metric of the network indicates a QoS issue. For example, as discussed in FIG. 9. In response to determining that the QoS metric indicates a QoS issue, the radio RF front-end device may send high priority packets first and, in some examples, may not send lower priority packets.

As noted herein, the disclosure discussed dropping packets in response to network QoS issues. One of ordinary skill in the art with the benefit of the present disclosure will appreciate that other responses may be used instead of, or in addition to discarding packets. For example, lower priority packets may be queued for a short time. If the network QoS issues are resolved or if it becomes possible to send the queued packets without impacting the higher priority packets, these queued packets may be sent. For example, if the QoS measurement is a bandwidth measurement and if at time t the bandwidth is not large enough to send all the packets awaiting transmission, then the RF front-end device may queue lower priority packets while sending higher priority packets. If at time t+1 the bandwidth increases, or the amount of high priority packets to be sent does not utilize all the available bandwidth (e.g., the transmitter lowered their transmission rate), the queued packets may be sent.

Figure 11:
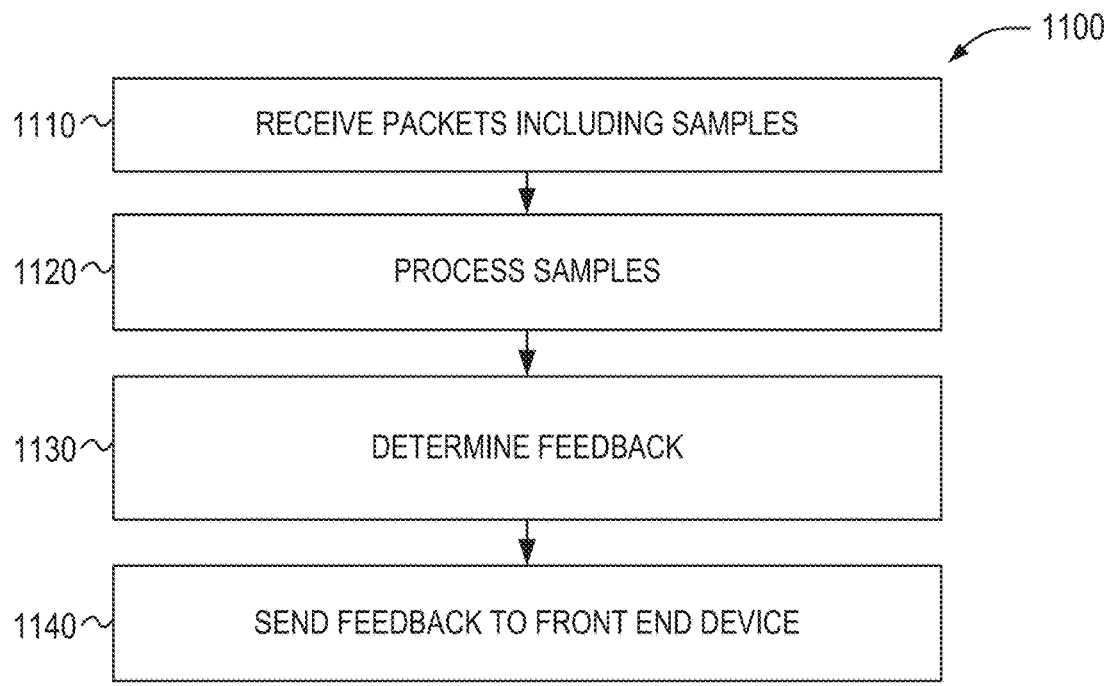
FIG. 11 illustrates a flowchart of a method of a digital processing computing device providing feedback on data types of samples according to some examples of the present disclosure.

Turning now to FIG. 11, a flowchart of a method 1100 of a digital processing computing device providing feedback on data types of samples is shown according to some examples of the present disclosure. At operation 1110, the digital processing computing device may receive packets that include ADC samples of a radio signal. The packets may be ordered based upon a packet number or some other data within the packet. At operation 1120 the packets may be ordered according to the ordering specified and used to reconstruct the received signal. The signal may then be processed, for example, by base band processing algorithms, error correction, encryption, modulation, demodulation, channelization, encoding, and other operations.

At operation 1130, the feedback for the RF front-end device may be determined. For example, the data type may be identified and a correlation between the samples and the data type may be determined. In some examples, where one data type is sent at a time, the data type determined may be provided as feedback. In other examples, where different data types or interspersed together, a pattern may be determined that may determine what data type correlates to specific data types.

For example, one or more machine-learning algorithms may be created that employ either supervised or unsupervised learning. Example algorithms may include sequence labeling methods such as Conditional Random Fields, Hidden Markov Models. Maximum Entropy Markov Models, Recurrent Neural Networks, and the like that identify sequences in the samples to determine a data type being received. In some examples, rather than the digital processing computing device using the model, the model may be created by the digital processing computing device and sent to the radio RF front-end device. The radio RF front-end device then applies the model to determine data types corresponding to the samples using the sequence labeling methods. This may allow the radio RF front-end device to prioritize packets without receiving periodic feedback from the digital processing computing device or the transmitter, aside from receiving the model and any updates to the model.

At operation 1140, the feedback may be sent to the RF front-end device. As noted, the feedback may be a pattern that is applied by the RF front-end device. For example, samples 1-9 corresponds to control information, then samples 10-20 correspond to audio data, then samples 21-32 correspond to more control information, followed by samples 33-64 correspond to video data. The RF front-end device may use this pattern information to categorize samples and to prioritize important portions of the signal. In other examples, the feedback may simply be an indication of a currently received data type.

Figure 12:
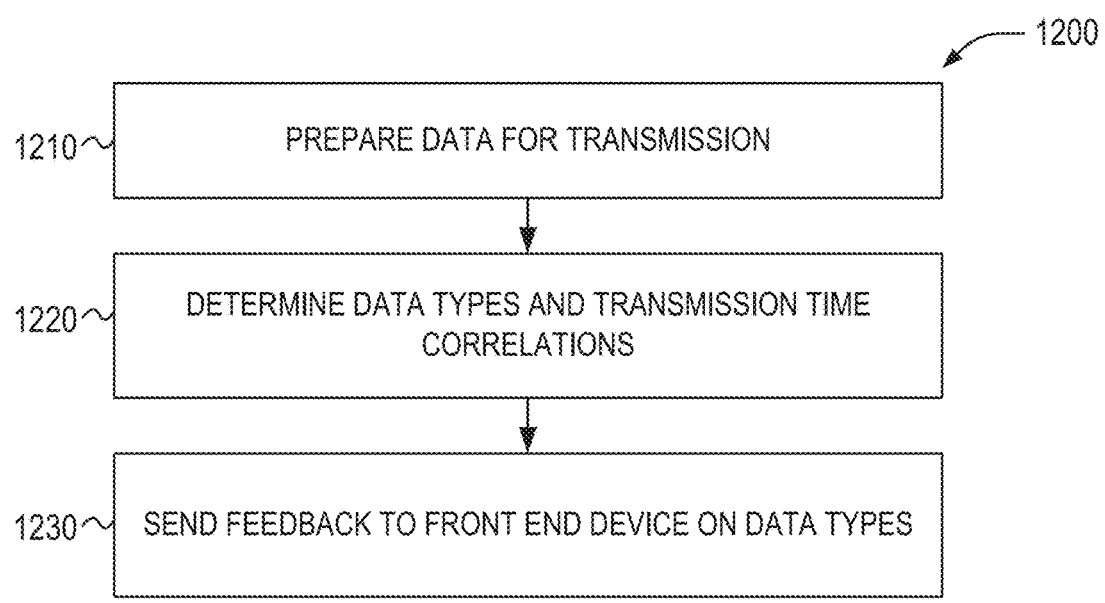
FIG. 12 illustrates a flowchart of a method of a transmitting device providing feedback on data types of samples according to some examples of the present disclosure.

Turning now to FIG. 12, a flowchart of a method 1200 of a transmitting device providing feedback on data types of samples is shown according to some examples of the present disclosure. The transmitting device transmits data to the RF front-end device over one or more radio links. As noted, the transmitting device may be a base station, a WiFi access point, another software defined radio, or the like. The device is noted as a transmitter, but can also be a transceiver.

At operation 1210 the transmitter may prepare data for transmission. The data may be data received from another device, or may be data received from one or more applications executing on the transmitter. At operation 1220, the data types of the data may be determined and correlated to specific transmission times. At operation 1230, the feedback may be sent to the RF front-end device. The feedback may be the data types and transmission time correlations that may be used by the RF front-end device to determine which samples correlate to which data types. The feedback data may be sent using one or more radio links or channels, an out of band connection, or the like.

While the disclosure herein has described the RF front-end device making decisions to drop packets with lower-priority samples (e.g., samples with lesser significant bits), in other examples, the packets may be labelled as to the significance of the bits and other network nodes (e.g., routers) may drop or slow packets with lesser significant bits. For example, a router may determine that two packets in a queue were from a same RF front end and that a first packet has more significant bits than a second packet (e.g., the packets may be labelled). The router may treat the first packet with a higher priority than the second packet. For example, the router may transmit the first packet to a next hop towards the destination but not transmit the second packet.

Furthermore, as described, the digital processing computing device may fill in missing bits from the samples with either zeros or ones. In yet other examples, the digital processing computing device may perform interpolation of samples to minimize a mean square error. Interpolation may be achieved by passing the bits through a digital low pass filter.

Figure 13:
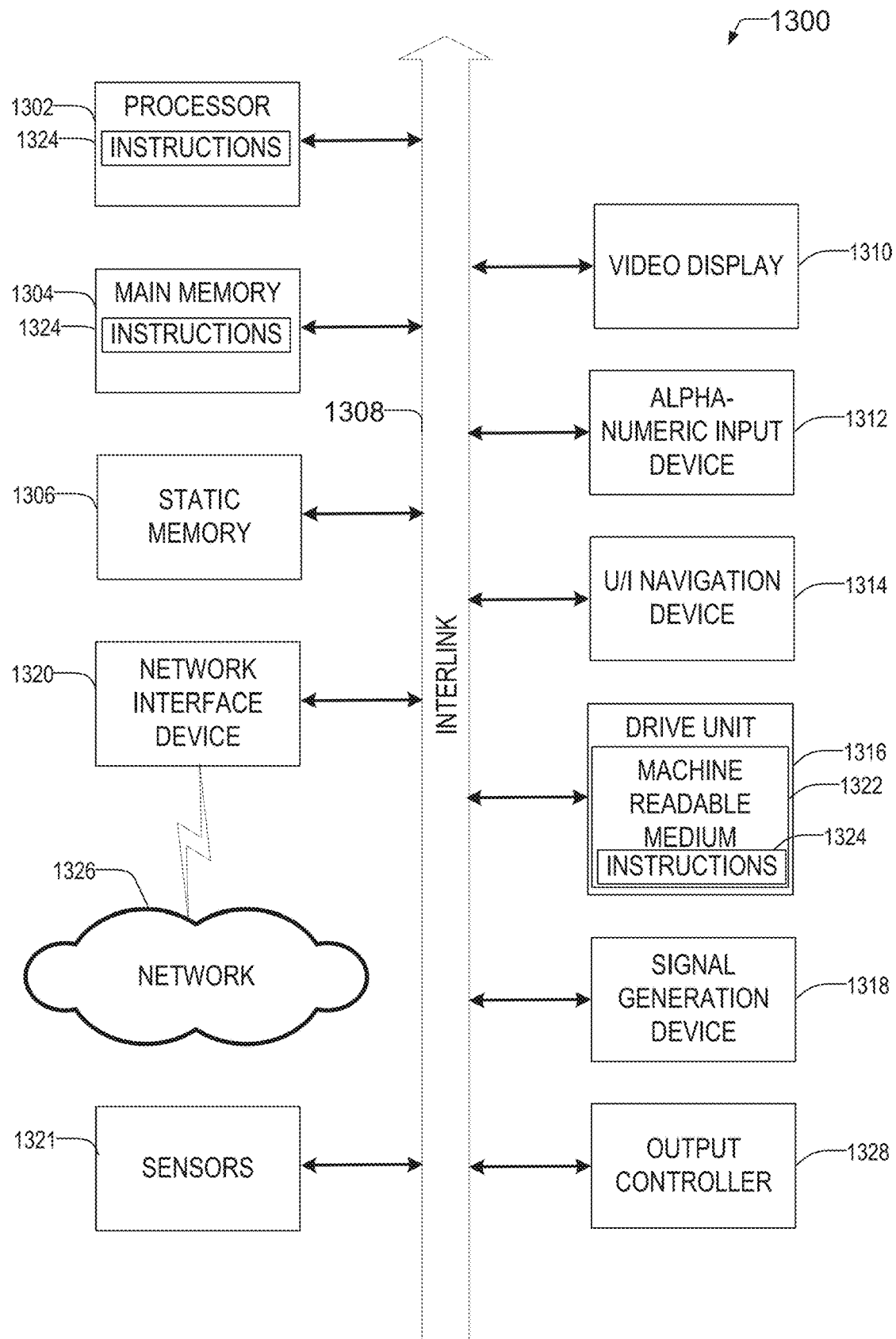
FIG. 13 illustrates a block diagram of an example of a machine upon which one or more embodiments described herein may be implemented.

FIG. 13 illustrates a block diagram of an example machine 1300 upon which any one or more of the techniques (e.g., methodologies) discussed herein may perform. In alternative embodiments, the machine 1300 may operate as a standalone device or may be connected (e.g., networked) to other machines. In a networked deployment, the machine 1300 may operate in the capacity of a server machine, a client machine, or both in server-client network environments. In an example, the machine 1300 may act as a peer machine in peer-to-peer (P2P) (or other distributed) network environment. The machine 1300 may take the form of a personal computer (PC), a tablet PC, a set-top box (STB), a personal digital assistant (PDA), a mobile telephone, a smart phone, a web appliance, a network router, switch or bridge, or any machine capable of executing instructions (sequential or otherwise) that specify actions to be taken by that machine. Machine 1300 may be configured to implement the RF front-end devices, digital processing computing devices, and transceivers of FIGS. 1-11. Additionally, the machine 1300 is shown with certain components, however, one of ordinary skill in the art will appreciate that additional or fewer components may be included in a particular example of machine 1300. For example, if the machine 1300 is configured as an RF front-end, additional radio hardware may be included and components such as a U/I navigation device 1314, video display 1310, alpha-numeric input device 1312 may not be included. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations. Machine 1300 may be configured to implement one or more of the methods or systems of FIG. 5-11.

Examples, as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

Machine (e.g., computer system) 1300 may include a hardware processor 1302 (e.g., a central processing unit (CPU), a graphics processing unit (GPU), a hardware processor core, or any combination thereof), a main memory 1304 and a static memory 1306, some or all of which may communicate with each other via an interlink (e.g., bus) 1308. The machine 1300 may further include a display unit 1310, an alphanumeric input device 1312 (e.g., a keyboard), and a user interface (UI) navigation device 1314 (e.g., a mouse). In an example, the display unit 1310, input device 1312 and UI navigation device 1314 may be a touch screen display. The machine 1300 may additionally include a storage device (e.g., drive unit) 1316, a signal generation device 1318 (e.g., a speaker), a network interface device 1320, and one or more sensors 1321, such as a global positioning system (GPS) sensor, compass, accelerometer, or other sensor. The machine 1300 may include an output controller 1328, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 1316 may include a machine readable medium 1322 on which is stored one or more sets of data structures or instructions 1324 (e.g., software) embodying or utilized by any one or more of the techniques or functions described herein. The instructions 1324 may also reside, completely or at least partially, within the main memory 1304, within static memory 1306, or within the hardware processor 1302 during execution thereof by the machine 1300. In an example, one or any combination of the hardware processor 1302, the main memory 1304, the static memory 1306, or the storage device 1316 may constitute machine readable media.

While the machine readable medium 1322 is illustrated as a single medium, the term "machine readable medium" may include a single medium or multiple media (e.g., a centralized or distributed database, and/or associated caches and servers) configured to store the one or more instructions 1324.

The term "machine readable medium" may include any medium that is capable of storing, encoding, or carrying instructions for execution by the machine 1300 and that cause the machine 1300 to perform any one or more of the techniques of the present disclosure, or that is capable of storing, encoding or carrying data structures used by or associated with such instructions. Non-limiting machine readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); Solid State Drives (SSD); and CD-ROM and DVD-ROM disks.

In some examples, machine readable media may include non-transitory machine readable media. In some examples, machine readable media may include machine readable media that is not a transitory propagating signal.

The instructions 1324 may further be transmitted or received over a communications network 1326 using a transmission medium via the network interface device 1320. The Machine 1300 may communicate with one or more other machines utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks). Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others. In an example, the network interface device 1320 may include one or more physical jacks (e.g., Ethernet, coaxial, or phone jacks) or one or more antennas to connect to the communications network 1326. In an example, the network interface device 1320 may include a plurality of antennas to wirelessly communicate using at least one of single-input multiple-output (SIMO), multiple-input multiple-output (MIMO), or multiple-input single-output (MISO) techniques. In some examples, the network interface device 1320 may wirelessly communicate using Multiple User MIMO techniques.

Other Notes and Examples

Example 1 is a method for prioritizing packets for a network-based software defined radio system, the method comprising: at a computing device, using one or more processors: receiving an output of an analog-to-digital converter (ADC), the output comprising a plurality of digital samples of a radio frequency (RF) signal, each digital sample representing the RF signal at a different time and comprising a plurality of bits including a most significant bit and a second bit that is less significant than the most significant bit; creating a first packet comprising a value of the most significant bit of a first digital sample of the plurality of digital samples and a value of the most significant bit of a second digital sample of the plurality of digital samples; creating a second packet comprising a value of the second bit of the first digital sample and a value of the second bit of the second digital sample; determining a metric of a network connection between the computing device and a server computing device, the server computing device providing baseband processing for the network-based software defined radio system; determining whether the metric of the network connection between the computing device and the server computing device indicates a quality of service (QoS) of the network connection that is below a threshold; and responsive to determining that the metric of the network connection between the computing device and the server computing device indicates the QoS of the network connection is below the threshold, sending the first packet to the server computing device over the network connection and not sending the second packet to the server computing device.

In Example 2, the subject matter of Example 1 includes, receiving metadata from a transmitter computing device or the server computing device indicating a type of data being transmitted by the transmitter and received in the RF signal: assigning, based upon the metadata, a priority to the first packet: and setting a priority field of a header of the first packet to the priority.

In Example 3, the subject matter of Example 2 includes, wherein the type of data comprises audio, video, or signaling data.

In Example 4, the subject matter of Example 3 includes, wherein assigning the priority to the first packet comprises assigning signaling data to a higher priority than audio or video data and audio data to a higher priority than video data.

In Example 5, the subject matter of Examples 2-4 includes, wherein the priority field of the header is a Quality of Service parameter.

In Example 6, the subject matter of Examples 1-5 includes, wherein the metric indicates one or more of: congestion, low bandwidth, packet loss, interference, or packet error.

In Example 7, the subject matter of Examples 1-6 includes, wherein the method further comprises: responsive to determining that the metric of the network connection between the computing device and the server computing device indicates the QoS of the network connection is below the threshold, sending the first packet twice.

In Example 8, the subject matter of Examples 1-7 includes, determining a first type of data being transmitted by a transmitter for a third packet and a second type of data being transmitted by the transmitter for a fourth packets created from the plurality of digital samples, the first type of data and the second type of data being different types; assigning, based upon the first type of data, a first priority to the third packet; assigning, based upon the second type of data, a second priority to the fourth packet, the second priority greater than the first priority; and responsive to determining that the metric of the network connection between the computing device and the server computing device indicates the QoS of the network connection is below the threshold, sending the third packet to the server computing device over the network connection and discarding the fourth packet without sending the fourth packet to the server computing device.

Example 9 is a computing device for prioritizing packets for a network-based software defined radio system, the computing device comprising: one or more processors; a memory, the memory comprising instructions, which when executed, cause the one or more processors to perform operations comprising: receiving an output of an analog-to-digital converter (ADC), the output comprising a plurality of digital samples of a radio frequency (RF) signal, each digital sample representing the RF signal at a different time and comprising a plurality of bits including a most significant bit and a second bit that is less significant than the most significant bit; creating a first packet comprising a value of the most significant bit of a first digital sample of the plurality of digital samples and a value of the most significant bit of a second digital sample of the plurality of digital samples; creating a second packet comprising a value of the second bit of the first digital sample and a value of the second bit of the second digital sample; determining a metric of a network connection between the computing device and a server computing device, the server computing device providing baseband processing for the network-based software defined radio system; determining whether the metric of the network connection between the computing device and the server computing device indicates a quality of service (QoS) of the network connection that is below a threshold; and responsive to determining that the metric of the network connection between the computing device and the server computing device indicates the QoS of the network connection is below the threshold, sending the first packet to the server computing device over the network connection and not sending the second packet to the server computing device.

In Example 10, the subject matter of Example 9 includes, wherein the operations further comprise: receiving metadata from a transmitter computing device or the server computing device indicating a type of data being transmitted by the transmitter and received in the RF signal; assigning, based upon the metadata, a priority to the first packet; and setting a priority field of a header of the first packet to the priority.

In Example 11, the subject matter of Example 10 includes, wherein the type of data comprises audio, video, or signaling data.

In Example 12, the subject matter of Example 11 includes, wherein the operations of assigning the priority to the first packet comprises assigning signaling data to a higher priority than audio or video data and audio data to a higher priority than video data.

In Example 13, the subject matter of Examples 10-12 includes, wherein the priority field of the header is a Quality of Service parameter.

In Example 14, the subject matter of Examples 9-13 includes, wherein the metric indicates one or more of: congestion, low bandwidth, packet loss, interference, or packet error.

In Example 15, the subject matter of Examples 9-14 includes, wherein the operations further comprise: responsive to determining that the metric of the network connection between the computing device and the server computing device indicates the QoS of the network connection is below the threshold, sending the first packet twice.

In Example 16, the subject matter of Examples 9-15 includes, wherein the operations further comprise: determining a first type of data being transmitted by a transmitter for a third packet and a second type of data being transmitted by the transmitter for a fourth packets created from the plurality of digital samples, the first type of data and the second type of data being different types; assigning, based upon the first type of data, a first priority to the third packet; assigning, based upon the second type of data, a second priority to the fourth packet, the second priority greater than the first priority; and responsive to determining that the metric of the network connection between the computing device and the server computing device indicates the QoS of the network connection is below the threshold, sending the third packet to the server computing device over the network connection and discarding the fourth packet without sending the fourth packet to the server computing device.

Example 17 is a machine-readable medium for prioritizing packets for a network-based software defined radio system, the machine-readable medium storing instructions, which when executed by a computing device, cause the computing device to perform operations comprising: receiving an output of an analog-to-digital converter (ADC), the output comprising a plurality of digital samples of a radio frequency (RF) signal, each digital sample representing the RF signal at a different time and comprising a plurality of bits including a most significant bit and a second bit that is less significant than the most significant bit; creating a first packet comprising a value of the most significant bit of a first digital sample of the plurality of digital samples and a value of the most significant bit of a second digital sample of the plurality of digital samples; creating a second packet comprising a value of the second bit of the first digital sample and a value of the second bit of the second digital sample; determining a metric of a network connection between the computing device and a server computing device, the server computing device providing baseband processing for the network-based software defined radio system; determining whether the metric of the network connection between the computing device and the server computing device indicates a quality of service (QoS) of the network connection that is below a threshold; and responsive to determining that the metric of the network connection between the computing device and the server computing device indicates the QoS of the network connection is below the threshold, sending the first packet to the server computing device over the network connection and not sending the second packet to the server computing device.

In Example 18, the subject matter of Example 17 includes, wherein the operations further comprise: receiving metadata from a transmitter computing device or the server computing device indicating a type of data being transmitted by the transmitter and received in the RF signal; assigning, based upon the metadata, a priority to the first packet; and setting a priority field of a header of the first packet to the priority.

In Example 19, the subject matter of Example 18 includes, wherein the type of data comprises audio, video, or signaling data.

In Example 20, the subject matter of Example 19 includes, wherein the operations of assigning the priority to the first packet comprises assigning signaling data to a higher priority than audio or video data and audio data to a higher priority than video data.

In Example 21, the subject matter of Examples 18-20 includes, wherein the priority field of the header is a Quality of Service parameter.

In Example 22, the subject matter of Examples 17-21 includes, wherein the metric indicates one or more of: congestion, low bandwidth, packet loss, interference, or packet error.

In Example 23, the subject matter of Examples 17-22 includes, wherein the operations further comprise: responsive to determining that the metric of the network connection between the computing device and the server computing device indicates the QoS of the network connection is below the threshold, sending the first packet twice.

In Example 24, the subject matter of Examples 17-23 includes, wherein the operations further comprise: determining a first type of data being transmitted by a transmitter for a third packet and a second type of data being transmitted by the transmitter for a fourth packets created from the plurality of digital samples, the first type of data and the second type of data being different types; assigning, based upon the first type of data, a first priority to the third packet; assigning, based upon the second type of data, a second priority to the fourth packet, the second priority greater than the first priority; and responsive to determining that the metric of the network connection between the computing device and the server computing device indicates the QoS of the network connection is below the threshold, sending the third packet to the server computing device over the network connection and discarding the fourth packet without sending the fourth packet to the server computing device.

Example 25 is a computing device for prioritizing packets for a network-based software defined radio system, the computing device comprising: means for receiving an output of an analog-to-digital converter (ADC), the output comprising a plurality of digital samples of a radio frequency (RF) signal, each digital sample representing the RF signal at a different time and comprising a plurality of bits including a most significant bit and a second bit that is less significant than the most significant bit; means for creating a first packet comprising a value of the most significant bit of a first digital sample of the plurality of digital samples and a value of the most significant bit of a second digital sample of the plurality of digital samples; means for creating a second packet comprising a value of the second bit of the first digital sample and a value of the second bit of the second digital sample; means for determining a metric of a network connection between the computing device and a server computing device, the server computing device providing baseband processing for the network-based software defined radio system; means for determining whether the metric of the network connection between the computing device and the server computing device indicates a quality of service (QoS) of the network connection that is below a threshold; and means for responsive to determining that the metric of the network connection between the computing device and the server computing device indicates the QoS of the network connection is below the threshold, sending the first packet to the server computing device over the network connection and not sending the second packet to the server computing device.

In Example 26, the subject matter of Example 25 includes, means for receiving metadata from a transmitter computing device or the server computing device indicating a type of data being transmitted by the transmitter and received in the RF signal; means for assigning, based upon the metadata, a priority to the first packet; and means for setting a priority field of a header of the first packet to the priority.

In Example 27, the subject matter of Example 26 includes, wherein the type of data comprises audio, video, or signaling data.

In Example 28, the subject matter of Example 27 includes, wherein the means for assigning the priority to the first packet comprises means for assigning signaling data to a higher priority than audio or video data and audio data to a higher priority than video data.

In Example 29, the subject matter of Examples 26-28 includes, wherein the priority field of the header is a Quality of Service parameter.

In Example 30, the subject matter of Examples 25-29 includes, wherein the metric indicates one or more of: congestion, low bandwidth, packet loss, interference, or packet error.

In Example 31, the subject matter of Examples 25-30 includes, wherein the computing device further comprises: means for, responsive to determining that the metric of the network connection between the computing device and the server computing device indicates the QoS of the network connection is below the threshold, sending the first packet twice.

In Example 32, the subject matter of Examples 25-31 includes, means for determining a first type of data being transmitted by a transmitter for a third packet and a second type of data being transmitted by the transmitter for a fourth packets created from the plurality of digital samples, the first type of data and the second type of data being different types; means for assigning, based upon the first type of data, a first priority to the third packet; means for assigning, based upon the second type of data, a second priority to the fourth packet, the second priority greater than the first priority; and means for, responsive to determining that the metric of the network connection between the computing device and the server computing device indicates the QoS of the network connection is below the threshold, sending the third packet to the server computing device over the means for network connection and discarding the fourth packet without sending the fourth packet to the server computing device.

Example 33 is at least one machine-readable medium including instructions that, when executed by processing circuitry, cause the processing circuitry to perform operations to implement of any of Examples 1-32.

Example 34 is an apparatus comprising means to implement of any of Examples 1-32.

Example 35 is a system to implement of any of Examples 1-32.

Example 36 is a method to implement of any of Examples 1-32.

What is claimed is:

1. A method for prioritizing packets for a network-based software defined radio system, the method comprising:
   at a computing device, using one or more processors:
   receiving an output of an analog-to-digital converter (ADC), the output comprising a plurality of digital samples of a radio frequency (RF) signal, each digital sample representing the RF signal at a different time and comprising a plurality of bits including a most significant bit and a second bit that is less significant than the most significant bit;
   creating a first packet comprising a value of the most significant bit of a first digital sample of the plurality of digital samples and a value of the most significant bit of a second digital sample of the plurality of digital samples;
   creating a second packet comprising a value of the second bit of the first digital sample and a value of the second bit of the second digital sample;
   determining a metric of a network connection between the computing device and a server computing device, the server computing device providing baseband processing for the network-based software defined radio system;
   determining whether the metric of the network connection between the computing device and the server computing device indicates a quality of service (QoS) of the network connection that is below a threshold; and
   responsive to determining that the metric of the network connection between the computing device and the server computing device indicates the QoS of the network connection is below the threshold, sending the first packet to the server computing device over the network connection and not sending the second packet to the server computing device.

2. The method of claim 1, further comprising:
   receiving metadata from a transmitter computing device or the server computing device indicating a type of data being transmitted by the transmitter and received in the RF signal;
   assigning, based upon the metadata, a priority to the first packet; and
   setting a priority field of a header of the first packet to the priority.

3. The method of claim 2, wherein the type of data comprises audio, video, or signaling data.

4. The method of claim 3, wherein assigning the priority to the first packet comprises assigning signaling data to a higher priority than audio or video data and audio data to a higher priority than video data.

5. The method of claim 2, wherein the priority field of the header is a Quality of Service parameter.

6. The method of claim 1, wherein the metric indicates one or more of: congestion, low bandwidth, packet loss, interference, or packet error.

7. The method of claim 1, wherein the method further comprises:
   responsive to determining that the metric of the network connection between the computing device and the server computing device indicates the QoS of the network connection is below the threshold, sending the first packet twice.

8. The method of claim 1, further comprising:
   determining a first type of data being transmitted by a transmitter for a third packet and a second type of data being transmitted by the transmitter for a fourth packets created from the plurality of digital samples, the first type of data and the second type of data being different types;
   assigning, based upon the first type of data, a first priority to the third packet;
   assigning, based upon the second type of data, a second priority to the fourth packet, the second priority greater than the first priority; and
   responsive to determining that the metric of the network connection between the computing device and the server computing device indicates the QoS of the network connection is below the threshold, sending the third packet to the server computing device over the network connection and discarding the fourth packet without sending the fourth packet to the server computing device.

9. A computing device for prioritizing packets for a network-based software defined radio system, the computing device comprising:
   one or more processors;
   a memory, the memory comprising instructions, which when executed, cause the one or more processors to perform operations comprising:
   receiving an output of an analog-to-digital converter (ADC), the output comprising a plurality of digital samples of a radio frequency (RF) signal, each digital sample representing the RF signal at a different time and comprising a plurality of bits including a most significant bit and a second bit that is less significant than the most significant bit;
   creating a first packet comprising a value of the most significant bit of a first digital sample of the plurality of digital samples and a value of the most significant bit of a second digital sample of the plurality of digital samples;
   creating a second packet comprising a value of the second bit of the first digital sample and a value of the second bit of the second digital sample;
   determining a metric of a network connection between the computing device and a server computing device, the server computing device providing baseband processing for the network-based software defined radio system;
   determining whether the metric of the network connection between the computing device and the server computing device indicates a quality of service (QoS) of the network connection that is below a threshold; and
   responsive to determining that the metric of the network connection between the computing device and the server computing device indicates the QoS of the network connection is below the threshold, sending the first packet to the server computing device over the network connection and not sending the second packet to the server computing device.

10. The computing device of claim 9, wherein the operations further comprise:

receiving metadata from a transmitter computing device or the server computing device indicating a type of data being transmitted by the transmitter and received in the RF signal;

assigning, based upon the metadata, a priority to the first packet; and setting a priority field of a header of the first packet to the priority.

11. The computing device of claim 10, wherein the type of data comprises audio, video, or signaling data.

12. The computing device of claim 11, wherein the operations of assigning the priority to the first packet comprises assigning signaling data to a higher priority than audio or video data and audio data to a higher priority than video data.

13. The computing device of claim 10, wherein the priority field of the header is a Quality of Service parameter.

14. The computing device of claim 9, wherein the metric indicates one or more of:

congestion, low bandwidth, packet loss, interference, or packet error.

15. The computing device of claim 9, wherein the operations further comprise:

responsive to determining that the metric of the network connection between the computing device and the server computing device indicates the QoS of the network connection is below the threshold, sending the first packet twice.

16. The computing device of claim 9, wherein the operations further comprise:

determining a first type of data being transmitted by a transmitter for a third packet and a second type of data being transmitted by the transmitter for a fourth packets created from the plurality of digital samples, the first type of data and the second type of data being different types;

assigning, based upon the first type of data, a first priority to the third packet;

assigning, based upon the second type of data, a second priority to the fourth packet, the second priority greater than the first priority; and responsive to determining that the metric of the network connection between the computing device and the server computing device indicates the QoS of the network connection is below the threshold, sending the third packet to the server computing device over the network connection and discarding the fourth packet without sending the fourth packet to the server computing device.

17. A machine-readable storage device for prioritizing packets for a network-based software defined radio system, the machine-readable medium storing instructions, which when executed by a computing device, cause the computing device to perform operations comprising:

receiving an output of an analog-to-digital converter (ADC), the output comprising a plurality of digital samples of a radio frequency (RF) signal, each digital sample representing the RF signal at a different time and comprising a plurality of bits including a most significant bit and a second bit that is less significant than the most significant bit;

creating a first packet comprising a value of the most significant bit of a first digital sample of the plurality of digital samples and a value of the most significant bit of a second digital sample of the plurality of digital samples;

creating a second packet comprising a value of the second bit of the first digital sample and a value of the second bit of the second digital sample;

determining a metric of a network connection between the computing device and a server computing device, the server computing device providing baseband processing for the network-based software defined radio system;

determining whether the metric of the network connection between the computing device and the server computing device indicates a quality of service (QoS) of the network connection that is below a threshold; and responsive to determining that the metric of the network connection between the computing device and the server computing device indicates the QoS of the network connection is below the threshold, sending the first packet to the server computing device over the network connection and not sending the second packet to the server computing device.

18. The machine-readable storage device of claim 17, wherein the operations further comprise:

receiving metadata from a transmitter computing device or the server computing device indicating a type of data being transmitted by the transmitter and received in the RF signal;

assigning, based upon the metadata, a priority to the first packet; and setting a priority field of a header of the first packet to the priority.

19. The machine-readable storage device of claim 18, wherein the type of data comprises audio, video, or signaling data.

20. The machine-readable storage device of claim 19, wherein the operations of assigning the priority to the first packet comprises assigning signaling data to a higher priority than audio or video data and audio data to a higher priority than video data.

* * * * *